(12) United States Patent
Lüdtke et al.

(10) Patent No.: US 6,998,180 B2
(45) Date of Patent: Feb. 14, 2006

(54) PACKAGE WITH A SUBSTRATE OF HIGH THERMAL CONDUCTIVITY

(75) Inventors: Arndt Lüdtke, Ehenbichl (AT); Heiko Wildner, Füssen (DE)

(73) Assignee: Plansee Aktiengesellschaft, Reutte (AT)

( * ) Notice: Subject to any disclaimer, the term of this patent is extended or adjusted under 35 U.S.C. 154(b) by 307 days.

(21) Appl. No.: 10/395,426

(22) Filed: Mar. 24, 2003

(65) Prior Publication Data
US 2003/0224554 A1  Dec. 4, 2003

(30) Foreign Application Priority Data
Mar. 22, 2002  (AT)  ............... GM183/2002

(51) Int. Cl.
*H01L 23/373* (2006.01)
*H01L 23/28* (2006.01)
*B32B 7/02* (2006.01)
*B32B 5/14* (2006.01)
*B32B 15/20* (2006.01)

(52) U.S. Cl. ............ 428/610; 428/602; 428/620; 428/621; 428/686; 438/122; 438/124; 438/127

(58) Field of Classification Search ............... 428/610, 428/602, 620, 621, 686; 438/122, 127, 124
See application file for complete search history.

(56) References Cited

U.S. PATENT DOCUMENTS

| 4,950,554 A | 8/1990 | Fusco |
|---|---|---|
| 5,299,214 A | 3/1994 | Nakamura et al. |
| 5,305,947 A | 4/1994 | Osada et al. |

(Continued)

FOREIGN PATENT DOCUMENTS

DE     42 40 843 A1     6/1994

(Continued)

OTHER PUBLICATIONS

Robert M. Jones: "Mechanics of Composite Materials", *Hemisphere Publishing Corporation*, New York, 1975, pp. 154-155.

*Primary Examiner*—Jennifer McNeil
*Assistant Examiner*—Jason Savage
(74) *Attorney, Agent, or Firm*—Laurence A. Greenberg; Werner H. Stemer; Ralph E. Locher

(57) ABSTRACT

A package is configured as a composite component with a substrate, at least one semiconductor component, and an enclosure, which are joined to one another. The heat-dissipating substrate is a single-layer or multilayer substrate with a thermal conductivity, transversely with respect to a joining surface to which the semiconductor component is joined, of greater than 170 W/m. The substrate may be a layered structure and/or a structure of graduated material composition, and it has an asymmetrical thermal expansion characteristic. By suitable selection the layers or the material graduation, it is possible to reduce and limit the shear distortion of the composite component formed of the substrate, the semiconductor component, and the enclosure.

13 Claims, 1 Drawing Sheet

U.S. PATENT DOCUMENTS

| | | |
|---|---|---|
| 5,451,817 A | 9/1995 | Osada et al. |
| 5,493,153 A | 2/1996 | Arikawa et al. |
| 5,525,428 A | 6/1996 | Osada et al. |
| 5,681,663 A | 10/1997 | Schaller et al. |
| 5,988,488 A | 11/1999 | Slattery et al. |
| 6,031,285 A * | 2/2000 | Nishibayashi ............... 257/706 |
| 6,114,048 A * | 9/2000 | Jech et al. .................. 428/547 |
| 6,271,585 B1 * | 8/2001 | Osada et al. ................ 257/712 |
| 2001/0038140 A1 | 11/2001 | Karker et al. |

FOREIGN PATENT DOCUMENTS

| | | |
|---|---|---|
| DE | 196 05 302 A1 | 8/1997 |
| EP | 0 100 232 A2 | 2/1984 |
| EP | 0 482 812 A2 | 4/1992 |
| EP | 0 521 405 A1 | 1/1993 |
| JP | 08-051172 | 2/1996 |

* cited by examiner

Max Distortion

PACKAGE WITH A SUBSTRATE OF HIGH THERMAL CONDUCTIVITY

BACKGROUND OF THE INVENTION

Field of the Invention

The invention relates to a package which comprises at least one semiconductor component, a substrate and an enclosure, the substrate having the function of dissipating the heat which is formed when the semiconductor component(s) is/are operating.

The substrate, the semiconductor component, and the mechanically stable enclosure are the main constituents of a package. The terms heat sink, heat spreader or carrier plate are also frequently used for the substrate. The semiconductor component consists, for example, of single-crystalline silicon or gallium arsenide. It is joined to the substrate, the joining technique used generally being soldering processes. The substrate has the function of dissipating the heat which forms when the semiconductor component is operating. Examples of semiconductor components which develop particularly large amounts of heat are LDMOSs (laterally diffused metal oxide semiconductors), laser diodes, CPUs (central processing units), MPUs (microprocessor units) and HFADs (high frequency amplifier devices). The geometric designs of the substrate are application-specific and they vary greatly. Simple shapes are small flat plates. However, complex substrates with recesses and steps are also used. The substrate itself is in turn joined to a mechanically stable enclosure, which may, for example, be designed in the form of a ceramic frame. The joining technique used to join substrate and enclosure is usually a soldering process. In the case of packages which are subject to high thermal loads, the following process sequence is customary. First of all, the ceramic frame is soldered to the substrate at a temperature of approx. 700° C. with the aid of silver-based solders. In a second process step, the electronic component(s) are soldered to the same side of the substrate.

The coefficients of thermal expansion of the semiconductor materials used are low compared to other materials and are given in the technical literature as $2.1 \times 10^{-6}$ K$^{-1}$ to $4.1 \times 10^{-6}$ K$^{-1}$ for silicon and as $5.6 \times 10^{-6}$ K$^{-1}$ to $5.8 \times 10^{-6}$ K$^{-1}$ for gallium arsenide. Other semiconductor materials which are not yet in widespread use on an industrial scale, such as for example germanium, InGaAsP or silicon carbide, have similarly low expansion coefficients. Ceramic materials, material composites or plastics are generally used for the enclosure. Examples of ceramic materials are $Al_2O_3$ with an expansion coefficient of $6.5 \times 10^{-6}$ K$^{-1}$ or aluminum nitride with an expansion coefficient of $4.5 \times 10^{-6}$ K$^{-1}$.

If the expansion characteristics of the components involved differs, stresses are built up in the composite. Such stresses can lead to distortion, to the components becoming detached, or to the components fracturing. Stresses may form even during the production of the package, specifically during the cooling phase from the soldering temperature to room temperature. However, temperature fluctuations which may range, for example, from −50° C. to 200° C. and may lead to thermomechanical stresses in the package also occur when the package is operating. If the stresses which form as a result of the joining of the enclosure and the substrate are compared with those which are caused by the joining of the substrate and the electronic components, the former are predominant. What this means is that distortion results mainly from the joining of the enclosure and the substrate.

The demands imposed on the substrate material arise from the foregoing statements. Firstly, it should have as high a thermal conductivity as possible, in order to keep the temperature rise in the semiconductor component as low as possible during operation. Secondly, it is necessary for the coefficient of thermal expansion to be matched as closely as possible to that of the semiconductor component and that of the enclosure. Single-phase, metallic materials do not sufficiently satisfy the required profile of properties, since the materials with a high thermal conductivity also have a high coefficient of thermal expansion. For example, the coefficient of thermal expansion of copper is $1.7 \times 10^{-5}$ K$^{-1}$, and that of aluminum is $3 \times 10^{-5}$ K$^{-1}$.

To satisfy the profile of requirements, composite materials and material composites are used to produce the substrate.

A metallic composite material is described in European patent application EP 0 100 232 (cf. U.S. Pat. Nos. 5,708,959; 5,563,101; and 5,525,428). The material comprises a tungsten skeleton with incorporated copper. With a composition of, for example, W-10 wt. % Cu, the thermal conductivity, depending on the production process, is from 170 to 200 W/mK, with a coefficient of thermal expansion of approx. $6.5 \times 10^{-6}$ K$^{-1}$. Nowadays, this material is in widespread use for substrates which are soldered to a ceramic enclosure.

In addition to tungsten-copper, molybdenum-copper composite materials are also used. While tungsten-copper materials can only be shaped by powder metallurgy and chip-forming processes, molybdenum-copper materials are generally processed by being rolled into sheets, from which the substrates are produced by punching or laser cutting. Molybdenum-copper materials are available both as composite materials and as laminated material composites. In the case of molybdenum-copper composite materials, the two phases are in finely dispersed form, while the laminated material composite is built up in layered form. Standard laminated material composites comprise three layers, the two outer layers being composed of copper and the middle layer being composed of molybdenum. The coefficient of thermal expansion of an Mo-30 wt. % Cu composite material is $7.5 \times 10^{-6}$ K$^{-1}$, with a thermal conductivity perpendicular to the substrate surface of 195 W/mK (in each case measured at room temperature).

A process for producing a Mo—Cu laminated material composite is described in U.S. Pat. No. 4,950,554. The structure is always symmetrical, i.e. the two outer copper layers have the same thickness. With a copper/Mo/copper thickness ratio of 0.13/0.74/0.13, the thermal conductivity perpendicular to the substrate surface is 170 W/mK, which is insufficient for many applications. If the thickness of the copper layers is increased, the thermal conductivity rises but so does the coefficient of thermal expansion. With a Cu/Mo/Cu thickness ratio of 0.33/0.33/0.33, the thermal conductivity perpendicular to the plane of the substrate is 251 W/mK, and the coefficient of thermal expansion is $8.6 \times 10^{-6}$K$^{-1}$. This is already unacceptably high for most applications, and consequently the substrate is distorted, for example, when it is soldered to an aluminum oxide enclosure, making form-fitting joining to the semiconductor components more difficult or completely impossible.

A laminated material composite comprising the layer sequence Cu—Mo—Cu—Cu for packages with a plastic enclosure is also described in U.S. Pat. No. 5,493,153. This tends to achieve better data but without ensuring sufficiently good dissipation of heat for semiconductor components which are subject to very high loads.

A heat sink with a layer structure is also known from German patent application DE 196 05 302 (cf. International PCT publication WO 97/030494). An intermediate layer, which consists of molybdenum, tungsten, aluminum nitride or pyrolytic graphite, is enclosed between copper layers. The thickness of the intermediate layer is selected in such a way that a coefficient of thermal expansion which differs from that of the semiconductor component by at most 10% is established at the mounting surface where the substrate is soldered to the semiconductor component. The examples mention a material composite of symmetrical structure in which the intermediate layer consists of molybdenum and has a thickness of 500 μm. A copper layer of in each case 50 μm is applied to both sides. In this way, although it is possible to suitably match the thermal expansion characteristics, the dissipation of heat is insufficient on account of the very thin copper layer.

The same restriction also applies to substrates described in European patent application EP 0 482 812 (cf. U.S. Pat. Nos. 5,451,817 and 5,305,947), which describes multilayer substrates in which the copper layers are produced by means of a melt/infiltration process.

Although the use of graduated layers which are enclosed between copper and tungsten in accordance with U.S. Pat. No. 5,988,488 reduces the shear stresses in the transition surface, it does not improve the dissipation of heat.

For the same reason, substrates in accordance with German patent application DE 42 40 843, which describes a Mo—Cu/Al$_2$O$_3$/Mo—Cu laminated material composite, has not found widespread use in practice.

U.S. Pat. No. 5,681,663 describes a three-layer composite in which the outer layers consist of copper. In order to avoid distortion during soldering in combination with the maximum possible thermal conductivity, which can be achieved by using suitably thick copper layers, a carrier strip with a lower coefficient of thermal expansion is welded to the three-layer composite. However, this causes thermomechanical stresses within the substrate, which can lead to distortion.

European patent application EP 0 521 405 (cf. U.S. Pat. No. 5,299,214) describes a substrate which, on the side which faces the semiconductor component, has a polycrystalline diamond layer. The very high thermal conductivity of diamond results in a correspondingly good heat-spreading action in the plane parallel to the surface. The absence of plastic deformability of the diamond layer may lead to cracks in the diamond layer even during cooling from the coating temperature.

In recent years, the process speed and degree of integration of the semiconductor components have risen greatly, which has also led to an increase in the evolution of heat in the package. Therefore, optimum heat management in the package represents an increasingly important criterion. The thermal conductivity of the tungsten-copper materials and laminated material composites described above is no longer sufficient for many applications. The availability of improved, inexpensive substrates represents a precondition for further optimization of packages.

SUMMARY OF THE INVENTION

It is accordingly an object of the invention to provide a package with a substrate having high thermal conductivity, which overcomes the above-mentioned disadvantages of the heretofore-known devices and methods of this general type and which provides for a substrate that, as it is being joined to the enclosure, is not unacceptably distorted, does not become detached, and is also not subject to any other defects.

With the foregoing and other objects in view there is provided, in accordance with the invention, a composite component package, comprising:

a substrate having a base surface and a joining surface opposite the base surface;

at least one semiconductor component joined to the joining surface of the substrate; and an enclosure joined to the substrate;

the substrate having a thermal conductivity, transversely to the joining surface, of greater than 170 W/mK and a material adjoining the semiconductor component with a modulus of elasticity of less than 750 Gpa; and the substrate having an asymmetrical thermal expansion with a coefficient of thermal expansion of the joining surface differing from a coefficient of thermal expansion of the base surface by at least 2%.

In other words, the objects of the invention are achieved by a package in which the substrate is designed as a layered composite having two or more layers which are joined to one another in a positively locking manner and/or as a material of graduated composition. The substrate has an asymmetrical thermal expansion, such that the coefficient of thermal expansion of the joining surface and of the base surface differ by at least 2%.

The substrate may be a single-layer substrate with a graduated material composition from the joining surface to the base surface, and/or it may be a multilayer substrate with a first material at the joining surface having the modulus of elasticity of less than 750 GPa and a second material at the base surface having a coefficient of thermal expansion differing from a coefficient of thermal expansion of the base surface.

A preferable distortion parameter, measured at the substrate base surface at room temperature, is less than 0.05 mm per 1 mm length. The distortion of the substrate, in a further embodiment of the invention, is defined by a material graduation from the joining surface to the base surface, respective layer thicknesses of a multilayer substrate, and/or a matching of materials.

In accordance with an added feature of the invention, the coefficient of thermal expansion $\alpha_{SF}$ of the joining surface and the coefficient of thermal expansion $\alpha_{SG}$ of the base surface satisfy the following condition: $1.02 < \alpha_{SG}/\alpha_{SF} < 8$.

In accordance with an additional feature of the invention, the substrate is a layer composite having a top layer facing the semiconductor component and consisting of Cu, Mo—Cu, W—Cu, Al, Ag, Au, AlN, BeO, and/or a carbon-fiber/copper composite.

In accordance with a further feature of the invention, the substrate is a three-layer composite having a first layer facing the enclosure and consisting of Cu or a Cu alloy, a second layer consisting of Mo—Cu, and a third layer consisting of Cu or a Cu alloy, and wherein a thickness $s_1$ of the first layer and a thickness $s_3$ of the third layer satisfy the following condition: $1.05 < s_3/s_1 < 5$.

With the above and other objects in view there is also provided, in accordance with the invention, a method of producing a composite component package, which comprises:

forming a heat-dissipating substrate having mutually opposite base and joining surfaces and a thermal conductivity perpendicular to the joining surface of greater than 170

W/mK and having a material adjoining the semiconductor component with a modulus of elasticity of less than 750 Gpa;

producing the substrate with an asymmetrical thermal expansion with a coefficient of thermal expansion of the joining surface and a coefficient of thermal expansion of the base surface differing by at least 2%; and joining a semiconductor component to the joining surface of the substrate and joining an enclosure to the substrate.

In all the prior art solutions, it has been attempted to avoid distortion of the substrate caused in the event of temperature changes by using a substrate structure which is as symmetrical as possible. In a layered composite, the distortion is determined primarily by the thicknesses of the individual layers. In the case of a three-layer composite, in which the two outer layers consist of the same material, the difference in thickness between these outer layers is crucial. The prior art endeavors to minimize this difference in thickness. In addition to the layer thickness, the modulus of elasticity, the Poisson's contraction and the expansion coefficient also influence the distortion which occurs, which need to be taken into account in particular in the case of a composite which is designed with an asymmetrical material structure. In the case of a layered composite, the distortion which corresponds to a temperature difference can be determined by simple model calculations. In the case of a complicated structure, as is the case, for example, with graduated materials, finite element calculations give the results required. The asymmetrical thermal expansion of a substrate can be determined very easily by using metrology to determine the thermal expansion at the respective surfaces. This can be achieved by sticking on heat-resistant strain gauges or by optical expansion measurement methods. If the thermal expansion at two opposite surfaces is measured, the difference between the thermal expansions determined in this way is proportional to the distortion which occurs when a substrate is heated or cooled.

This difference between the coefficients of thermal expansion is virtually zero for substrates which are currently used to dissipate heat in packages. Other substrates described in patent and scientific literature are also of substantially symmetrical structure. One exception is formed by substrates on which diamond layers have been deposited. These layers are deposited on the side to which the semiconductor component is soldered. On account of the high modulus of elasticity and the absence of plasticity in diamond, tensile stresses are built up even during cooling from the coating temperature, and these lead to incipient cracking. This is also a reason why diamond-coated substrates are not used. In the solutions which have been disclosed hitherto, the substrate was optimized in isolation from its environment, especially the enclosure. Efforts were directed at matching the coefficient of thermal expansion as closely as possible to that of the enclosure, in combination with the maximum possible thermal conductivity in the region to which the semiconductor component is soldered.

In the package, according to the present invention, the individual components are not optimized independently but rather the thermal expansion properties of the substrate are matched to those of the enclosure. This matching takes place in such a way that the overall distortion of the substrate/enclosure composite component is as low as possible.

This is explained, by way of example, on the basis of a package in which the enclosure is designed as a ceramic frame made from aluminum oxide. Aluminum oxide has a lower expansion coefficient than the usual substrate materials. Hitherto, substrates in which the coefficient of thermal expansion of the surface at which the substrate is soldered to the enclosure and the coefficient of thermal expansion of the opposite side are approximately equal have been used. Substrates made from a W—Cu composite material or a Cu/Mo/Cu layer composite represent the prior art. These substrates have a higher coefficient of thermal expansion than the ceramic frame. During cooling from the soldering temperature, tensile stresses are then incorporated in the substrate, specifically on the opposite side to the enclosure. These then lead to distortion of the frame/substrate assembly. This effect limits the increase in the thermal conductivity of the substrate, for example by increasing the Cu content in the W—Cu or the thickness of the copper layers in the Cu/Mo/Cu layered composite, since this would entail greater distortion in the frame/substrate assembly.

However, a package according to the present invention now includes a substrate which has a thermal expansion which is asymmetrical perpendicular to the surface for joining it to the enclosure. The result of this is that the distortion in the substrate/enclosure/semiconductor component composite component, which substantially results from the different thermal expansion characteristics of enclosure and substrate, is minimized. By way of example, if a substrate which has a coefficient of thermal expansion which is lower in the region of the surface where it is joined to the enclosure than on the opposite side is used, the heating operating during the soldering process leads to a U-shaped distortion of the substrate. The stresses in the substrate are reduced by means of relaxation phenomena. Now, during the cooling process, compressive stresses are incorporated in the substrate on the opposite side to the joining surface. As a result of the layer structure or the composition being selected appropriately with a graduated composite, it is now possible to ensure that the substrate bends back, so that the composite component is virtually flat.

However, it is also possible to carry out the soldering as a planar soldering operation. This is understood to mean that the components which are to be soldered are weighted, so that at the soldering temperature they become planar as a result of creep phenomena. If the soldering is now carried out as a planar soldering operation and if the mean expansion coefficient of the enclosure is lower than that of the substrate, the result is a planar substrate/enclosure composite component if the expansion coefficient on the opposite side of the substrate from the joining surface is lower.

In a layered composite, the determination of the thicknesses of the individual layers or of the materials in order to achieve the difference between the coefficients of thermal expansion and the corresponding absence of distortion in accordance with the invention in the substrate/enclosure/semiconductor component composite, can be effected simply with the aid of the calculation model used for shear-resistant plates (cf. Jones, R. M.: Mechanics of Composite Materials, Hemisphere Publishing Corporation (1975)). Finite element calculations should be used for substrates with graduated compositions.

This makes it possible to use substrates which have a higher coefficient of thermal expansion. This therefore, by way of example, makes it possible to use substrates with thicker Cu layers, which improve the dissipation of heat from the semiconductor component. Producing layer composites with different thicknesses of the layers can be achieved in a simple way, for example, by roll cladding, in which case the thicknesses of the starting formats used determine the thicknesses of the layers in the rolled state.

The concept of asymmetrical thermal expansion can also be applied to materials of graduated structure. This can be explained with reference to the example of W—Cu. The use of W powder with different grain sizes and corresponding filling devices makes it possible to use presses to produce a green body which has a transition from fine powder particles to coarse powder particles which is continuous over the cross section. The unsintered density is lower in the region of fine powder particles, therefore the porosity is higher in this region than in the region of coarse powder particles. If this green body is then sintered at a temperature at which only bridge formation occurs but macroscopic shrinkage does not, the different porosity is retained over the cross section even after the sintering process. After the process of infiltration with copper, the copper content is higher in the region of fine W particles and decreases in graduated form toward coarse W particles.

It is therefore possible to produce graduated substrates which have a coefficient of thermal expansion which is asymmetrical perpendicular to the joining surface. In a particularly advantageous embodiment of the present invention, the substrate is designed as a three-layer composite. Enclosure and semiconductor component are soldered to the same side of the substrate. The first substrate layer, which is adjacent to the enclosure and semiconductor component, in this case consists of a material with a high thermal conductivity, such as for example Cu or a Cu alloy. Refractory metal/copper composite materials are particularly suitable for the middle layer. The third layer once again consists of copper. Examples of the ratio of the thicknesses of the copper layers to one another are given in the examples. Roll cladding should be mentioned as an inexpensive production process.

Other features which are considered as characteristic for the invention are set forth in the appended claims.

Although the invention is illustrated and described herein as embodied in a package with a substrate of high thermal conductivity, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments and exemplary implementations of the invention when read in connection with the accompanying drawings.

DETAILED DESCRIPTION OF THE PREFERRED EMBODIMENTS

Figure 1:
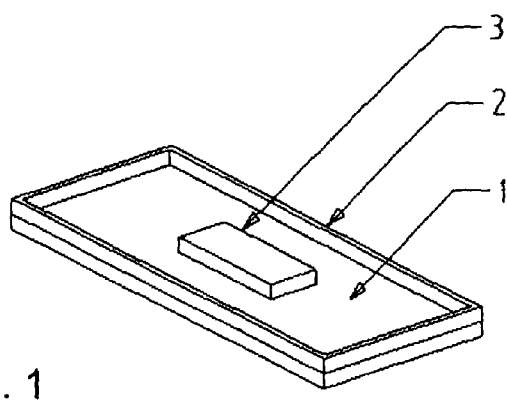
FIG. 1 is a diagrammatic, top perspective view of an assembly according to the invention.

Referring now to the figures of the drawing in detail and first, particularly, to FIG. 1 thereof, there is shown a package with a substrate 1, an enclosure 2, and an electronic component 3.

Figure 2:
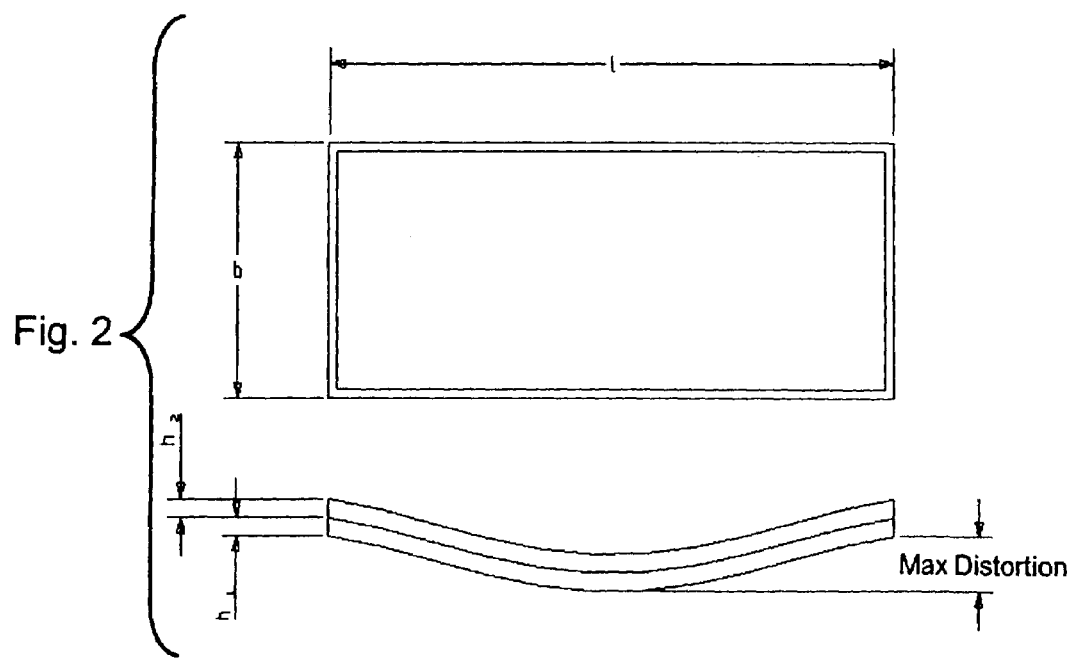
FIG. 2 is a top plan view and a side elevational view of an exemplary substrate according to the invention.

FIG. 2 shows the substrate 1 having a length l, a width b, and a thickness $h_1$, to which an enclosure having the thickness $h_2$, in accordance with the exemplary embodiments, has been soldered. The bottom part of FIG. 2 shows how the distortion of the package after the soldering process was determined. To do this, the maximum distortion, based on the length l of the substrate base surface, was determined.

EXAMPLES

Molybdenum powder was pressed to form a green body. The green body produced in this way was infiltrated with copper. The copper content was 30% by weight. Copper layers were applied to both sides by roll cladding, and the total thickness of the layer composite $h_1$ was in each case 1 mm. The thicknesses of the individual layers are given in the table below in Examples 1, 2, 4 and 5. Examples 1 and 4 constitute the prior art. Examples 2 and 5 are embodiments in accordance with the invention. Furthermore, in an embodiment which is likewise in accordance with the invention, according to Example 3 a Mo-30 wt. % Cu composite material was produced, and Cu was roll-clad onto one side of it. An Al sheet was soldered onto the Mo-30 wt. % Cu side. Substrates were produced from these material composites produced in this way by means of punching. The substrates had a geometry in the form of small plates with a length l of 34 mm, a width b of 14 mm and a thickness $h_1$ of 1 mm. The thicknesses of the individual layers are given in the table below.

Strain gauges were stuck to both sides of in each case three specimens per embodiment. The thermal expansions in the temperature range from 20° C.–250° C. were measured in an indirectly heated furnace, and the coefficients of thermal expansion were determined. The expression $\alpha_{SF}$ denotes the coefficient of thermal expansion of the first layer, and $\alpha_{SG}$ determines the coefficient of thermal expansion of the third layer. The substrates were each soldered to an $Al_2O_3$ frame with a thickness of 0.2 mm, a length of 34 mm and a width of 14 mm by means of a soldering process using a silver-based solder at a temperature of 700° C. The frame was soldered to that side of the substrate which has the coefficient of thermal expansion $\alpha_{SF}$. The distortion of the substrate/enclosure assembly at room temperature was determined in such a way that the magnitude of the maximum distortion depth of the substrate was determined, as illustrated in FIG. 1. These values are given in the table below and demonstrate that the substrates according to the invention have a significantly lower distortion.

| Example | Material of first layer (adjacent to enclosure) | Thickness of first layer [mm] | Material of second layer | Thickness of second layer | Material of third layer | Thickness of third layer [mm] | $\alpha_{SF}$ [*10$^{-6}$K$^{-1}$] | $\alpha_{SF}$ [*10$^{-6}$K$^{-1}$] | Amount of Distortion [mm] |
|---|---|---|---|---|---|---|---|---|---|
| 1 | Cu | 0.25 | Mo-30 wt. % Cu | 0.5 | Cu | 0.25 | 10.4 | 10.4 | 0.387 |
| 2 | Cu | 0.17 | Mo-30 wt. % Cu | 0.5 | Cu | 0.33 | 7.21 | 13.8 | <0.01 |

-continued

| Example | Material of first layer (adjacent to enclosure) | Thickness of first layer [mm] | Material of second layer | Thickness of second layer | Material of third layer | Thickness of third layer [mm] | $\alpha_{SF}$ [*10$^{-6}$K$^{-1}$] | $\alpha_{SF}$ [*10$^{-6}$K$^{-1}$] | Amount of Distortion [mm] |
|---|---|---|---|---|---|---|---|---|---|
| 3 | Cu | 0.175 | Mo-30 wt. % Cu | 0.5 | Al | 0.325 | 7.22 | 13.9 | <0.01 |
| 4 | Cu | 0.125 | Mo-30 wt. % Cu | 0.75 | Cu | 0.125 | 7.96 | 7.96 | 0.137 |
| 5 | Cu | 0.1 | Mo-30 wt. % Cu | 0.75 | Cu | 0.15 | 6.76 | 9.21 | <0.01 |

We claim:

1. A composite component package, comprising:
a substrate having a base surface and a joining surface opposite said base surface;
at least one semiconductor component joined to said joining surface of said substrate; and
an enclosure joined to said substrate;
wherein said substrate is a three-layer composite having a first layer facing said enclosure and consisting of Cu or a Cu alloy, a second layer consisting of Mo—Cu, and a third layer consisting of Cu or a Cu alloy, and wherein a thickness $s_1$ of said first layer and a thickness $s_3$ of said third layer satisfy the following condition: $1.05 < s_3/s_1 < 5$;
said substrate having a thermal conductivity, transversely to said joining surface, of greater than 170 W/mK; and
said substrate having an asymmetrical thermal expansion with a coefficient of thermal expansion of said joining surface differing from a coefficient of thermal expansion of said base surface by at least 2%.

2. The package according to claim 1, wherein said substrate is a single-layer substrate having a graduated material composition from said joining surface to said base surface.

3. The package according to claim 1, wherein said substrate is a multilayer substrate with a first material at said joining surface having a modulus of elasticity of less than 750 GPa and a second material at said base surface having a coefficient of thermal expansion differing from a coefficient of thermal expansion of said base surface.

4. The package according to claim 1, wherein a distortion, measured at said substrate base surface at room temperature, is less than 0.05 mm per 1 mm length.

5. The package according to claim 4, wherein said distortion of said substrate is defined by a material variation selected from the group consisting of a material graduation from said joining surface to said base surface, respective layer thicknesses of a multilayer substrate, and a matching of materials.

6. The package according to claim 1, wherein the coefficient of thermal expansion $\alpha_{SF}$ of said joining surface and the coefficient of thermal expansion $\alpha_{SG}$ of said base surface satisfy the following condition: $1.02 < \alpha_{SG}/\alpha_{SF} < 8$.

7. The package according to claim 1, wherein said substrate is a layer composite having a top layer facing said semiconductor component and consisting of a material selected from the group consisting of Cu, Mo—Cu, W—Cu, Al, Ag, Au, AlN, BeO, and a carbon-fiber/copper composite.

8. A method of producing a composite component package, which comprises:
forming a heat-dissipating substrate having mutually opposite base and joining surfaces and a thermal conductivity perpendicular to the joining surface of greater than 170 W/mK;
forming the substrate as a three-layer composite having a first layer facing the enclosure and consisting of Cu or a Cu alloy, a second layer consisting of Mo—Cu, and a third layer consisting of Cu or a Cu alloy, and wherein a thickness $s_1$ of the first layer and a thickness $s_3$ of the third layer satisfy the following condition: $1.05 < s_3/s_1 < 5$;
producing the substrate with an asymmetrical thermal expansion with a coefficient of thermal expansion of the joining surface and a coefficient of thermal expansion of the base surface differing by at least 2%; and
joining a semiconductor component to the joining surface of the substrate and joining an enclosure to the substrate.

9. The method according to claim 8, which comprises forming the substrate as a single-layer substrate with a graduated material composition.

10. The method according to claim 8, which comprises forming the substrate as a multilayer substrate with a layer adjoining the semiconductor component consisting of a material having a modulus of elasticity of less than 750 GPa.

11. The method according to claim 8, which comprises forming the substrate to exhibit a distortion at room temperature, measured at the base surface of the substrate, of less than 0.05 mm per 1 mm length.

12. The method according to claim 11, which comprises adjusting a material graduation from the joining surface to the base surface to define the distortion of less than 0.05 mm per 1 mm length.

13. The method according to claim 11, which comprises forming the substrate as a multilayer substrate and matching the materials of the layers and/or the layer thicknesses to define the distortion of less than 0.05 mm per 1 mm length.

* * * * *